(12) United States Patent
He

(10) Patent No.: US 12,002,791 B2
(45) Date of Patent: Jun. 4, 2024

(54) LIGHT EMITTING DEVICE, DISPLAY PANEL, AND DISPLAY PANEL MANUFACTURING METHOD

(71) Applicant: SHENZHEN CHINA STAR OPTOELECTRONICS SEMICONDUCTOR DISPLAY TECHNOLOGY CO., LTD., Shenzhen (CN)

(72) Inventor: Kunpeng He, Shenzhen (CN)

(73) Assignee: SHENZHEN CHINA STAR OPTOELECTRONICS SEMICONDUCTOR DISPLAY TECHNOLOGY CO., LTD., Shenzhen (CN)

( * ) Notice: Subject to any disclaimer, the term of this patent is extended or adjusted under 35 U.S.C. 154(b) by 389 days.

(21) Appl. No.: 17/435,153

(22) PCT Filed: Jun. 8, 2021

(86) PCT No.: PCT/CN2021/098778
§ 371 (c)(1),
(2) Date: Aug. 31, 2021

(87) PCT Pub. No.: WO2022/252249
PCT Pub. Date: Dec. 8, 2022

(65) Prior Publication Data
US 2023/0207535 A1 Jun. 29, 2023

(30) Foreign Application Priority Data
May 31, 2021 (CN) .......................... 202110602008.5

(51) Int. Cl.
*H01L 25/07* (2006.01)
*H01L 25/075* (2006.01)
*H01L 33/62* (2010.01)

(52) U.S. Cl.
CPC .......... *H01L 25/0753* (2013.01); *H01L 33/62* (2013.01); *H01L 2933/0066* (2013.01)

(58) Field of Classification Search
CPC ................ H01L 25/0753; H01L 33/62; H01L 2933/0066; H01L 33/00; H01L 2933/0016;
(Continued)

(56) References Cited

U.S. PATENT DOCUMENTS

2009/0211640 A1* 8/2009 Lee ........................ B82Y 10/00
313/504
2014/0048812 A1* 2/2014 Nakano ............... H01L 27/1255
257/71

(Continued)

FOREIGN PATENT DOCUMENTS

CN 102916101 A * 2/2013
CN 102916101 A 2/2013
(Continued)

*Primary Examiner* — S M Sohel Imtiaz
(74) *Attorney, Agent, or Firm* — The Roy Gross Law Firm, LLC; Roy Gross

(57) ABSTRACT

A light emitting device, a display panel, and a display panel manufacturing method are provided in the embodiments of the present disclosure. The light emitting device includes a first electrode, and second electrode arranged around the first electrode, and the second electrode is symmetrically disposed with respect to the first electrode. A distance from each of points on the second electrode to a center point of the first electrode is equal. When the light emitting device is transferring, any point on the second electrode abuts the corresponding electrode, thereby reducing the difficulty in a mass transfer process of the light-emitting device.

20 Claims, 3 Drawing Sheets

(58) Field of Classification Search
CPC ......... H01L 27/15; H01L 33/38; H01L 33/40; H01L 33/42; H01L 33/44
See application file for complete search history.

(56) References Cited

U.S. PATENT DOCUMENTS

| | | | |
|---|---|---|---|
| 2019/0058021 A1* | 2/2019 | Kim | H10K 50/84 |
| 2019/0157512 A1* | 5/2019 | Jung | H01L 25/167 |
| 2020/0212026 A1* | 7/2020 | Son | H01L 25/167 |
| 2021/0050325 A1* | 2/2021 | Kim | H01L 33/62 |
| 2023/0268456 A1* | 8/2023 | Kim | H01L 25/0753 |
| | | | 257/89 |

FOREIGN PATENT DOCUMENTS

| | | | | |
|---|---|---|---|---|
| CN | 103000640 A | | 3/2013 | |
| CN | 103943649 A | | 7/2014 | |
| CN | 107611283 A | | 1/2018 | |
| CN | 108198838 A | * 6/2018 | ......... H01L 27/3246 |
| CN | 108198838 A | | 6/2018 | |
| CN | 108230091 A | | 6/2018 | |
| CN | 109830584 A | | 5/2019 | |

* cited by examiner

LIGHT EMITTING DEVICE, DISPLAY PANEL, AND DISPLAY PANEL MANUFACTURING METHOD

This application is a National Phase of PCT Patent Application No. PCT/CN2021/098778 having International filing date of Jun. 8, 2021, which claims the benefit of priority of Chinese Patent Application No. 202110602008.5, filed May 31, 2021, the contents of which are all incorporated herein by reference in their entirety.

FIELD OF INVENTION

The present disclosure relates to the field of display technologies, and more particularly, to a light emitting device, a display panel, and a display panel manufacturing method.

BACKGROUND OF INVENTION

Micro light emitting diodes (Micro LED) and Mini light emitting diodes (Mini LED) are superior to existing organic light emitting diodes (OLED) and liquid crystal displays (LCD) in terms of display brightness, color gamut, residual image, power consumption, and service life. However, the current technical limitation for mass production is the massive transfer process. The existing technology cannot mount a large number of light emitting devices on corresponding positions of a driving board (including a first substrate and a thin film transistor (TFT) device) within a relatively short cycle time.

Moreover, most of the existing light emitting devices are designed as axisymmetric PN electrodes. This type of design requires the equipment to align and install the LED components in a correct direction when transferring the LED components, which highly increases the difficulty in transfer and repair.

Therefore, the existing display panel has a technical problem that the alignment of massive transfer of light emitting devices is hard.

Technical Problems

The embodiments of the present disclosure provide a light emitting device and a display panel manufacturing method, which can alleviate the technical problem that the alignment of massive transfer of light emitting devices is hard.

SUMMARY OF INVENTION

Technical Solutions

In order to solves the above problems, the technical solutions provided by the present disclosure are as follow:

The present disclosure provides a light emitting device, including:
  a first substrate;
  a N-type contact layer disposed on the first substrate;
  an active layer disposed on the N-type contact layer; and
  a P-type contact layer disposed on the active layer;
  wherein a first electrode and a second electrode arranged around the first electrode are disposed on the P-type contact layer.

Optionally, in some embodiments of the present disclosure, a PN insulating layer is disposed between the first electrode and the second electrode.

Optionally, in some embodiments of the present disclosure, either the first electrode is the N-type electrode, and the second electrode is the P-type electrode, or the first electrode is the P-type electrode, and the second electrode is the N-type electrode.

Optionally, in some embodiments of the present disclosure, the second electrode is arranged around the first electrode, and a distance from each of points on the second electrode to a center point of the first electrode is equal.

Optionally, in some embodiments of the present disclosure, a width of the first electrode is greater than or equal to a width of the second electrode in a same cross section.

Optionally, in some embodiments of the present disclosure, a first encapsulation layer is disposed on a surface of the second electrode away from the first electrode, and the first encapsulation layer is arranged around the second electrode.

Optionally, in some embodiments of the present disclosure, the first electrode has a cylindrical structure, and the second electrode has a circular ring structure.

Optionally, in some embodiments of the present disclosure, a preparation material of the P-type contact layer includes gallium nitride.

Optionally, in some embodiments of the present disclosure, a preparation material of the N-type contact layer includes gallium nitride.

The present disclosure further provides a display panel, including:
  a second substrate;
  a thin film transistor (TFT) device disposed on the second substrate, wherein the TFT device includes a source electrode and a ground terminal; and
  a light emitting device disposed on the second substrate, wherein the light emitting device includes a first electrode, and a second electrode arranged around the first electrode;
  wherein in response to the first electrode being a P-type electrode, the first electrode is arranged in abutment with the source electrode, and the second electrode is arranged in abutment with the ground terminal, or in response to the first electrode being an N-type electrode, the first electrode is arranged in abutment with the ground terminal, and the second electrode is arranged in abutment with the source electrode.

Optionally, in some embodiments of the present disclosure, either the first electrode is the N-type electrode, and the second electrode is the P-type electrode, or the first electrode is the P-type electrode, and the second electrode is the N-type electrode.

Optionally, in some embodiments of the present disclosure, the second electrode is arranged around the first electrode, and a distance from each of points on the second electrode to a center point of the first electrode is equal.

Optionally, in some embodiments of the present disclosure, a width of the first electrode is greater than or equal to a width of the second electrode.

Optionally, in some embodiments of the present disclosure, the first electrode is the N-type electrode, the first electrode is arranged in abutment with the ground terminal, and the second electrode is arranged in abutment with the source electrode.

Optionally, in some embodiments of the present disclosure, the second electrode is the N-type electrode, the second electrode is arranged in abutment with the ground terminal, and the first electrode is arranged in abutment with the source electrode.

Optionally, in some embodiments of the present disclosure, a black matrix layer is disposed above the TFT device.

Optionally, in some embodiments of the present disclosure, a second encapsulation layer is disposed above the black matrix layer and the light emitting device.

The present disclosure further provides a display panel manufacturing method, including steps of:
providing a second substrate;
forming a thin film transistor (TFT) device on the second substrate;
providing a light emitting device, wherein the light emitting device includes a first electrode, and a second electrode arranged around the first electrode, wherein the second electrode is symmetrically disposed with respect to the first electrode; and
transferring the light emitting device to the second substrate, such that a P-type electrode abuts the source electrode, and an N-type electrode abuts the ground terminal.

Optionally, in some embodiments of the present disclosure, the transferring the light emitting device to the second substrate further includes a step of: abutting and aligning the second electrode and the ground terminal in response to the first electrode of the light emitting device being the P-type electrode and the second electrode being the N-type electrode.

Optionally, in some embodiments of the present disclosure, the transferring the light emitting device to the second substrate further includes a step of: abutting and aligning the second electrode and the source electrode in response to the first electrode of the light emitting device being the N-type electrode and the second electrode being the P-type electrode.

Beneficial Effect

The light emitting device provided by the embodiment of the present disclosure includes a first substrate, a N-type contact layer disposed on the first substrate, an active layer disposed on the N-type contact layer, and a P-type contact layer disposed on the active layer; wherein a first electrode and a second electrode arranged around the first electrode are disposed on the P-type contact layer. The transfer of Mini LED can be completed by arranging the second electrode around the first electrode, arranging the second electrode at a position where a distance from each of points on the second electrode to a center point of the first electrode is equal, and abutting and aligning any point on the second electrode with the corresponding electrode of the TFT device. The difficulty in the massive transfer of the light emitting device can be reduced.

DESCRIPTION OF DRAWINGS

In order to illustrate the embodiments of the present invention or prior art more clearly, the following figures will be described in the embodiments are briefly introduced. It is obvious that the drawings are merely some embodiments of the present invention, those of ordinary skill in this field can obtain other figures according to these figures without paying the premise.

DETAILED DESCRIPTION OF PREFERRED EMBODIMENTS

The following descriptions for the respective embodiments are specific embodiments capable of being implemented for illustrations of the present invention with referring to appended figures.

A light emitting device, a display panel, and a display panel manufacturing method are provided in the embodiments of the present disclosure. Detailed descriptions are given below. It should be noted that the order of description in the following embodiments is not meant to limit the preferred order of the embodiments.

Figure 1:
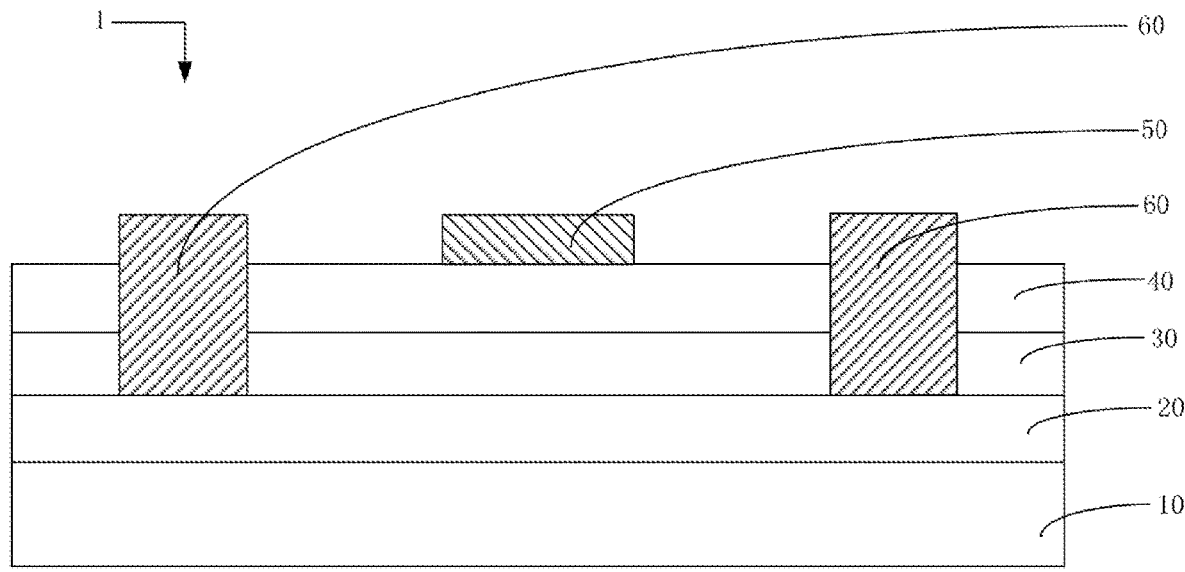
FIG. 1 is a first schematic cross-section view of a light emitting device provided by an embodiment of the present disclosure.
Figure 2:
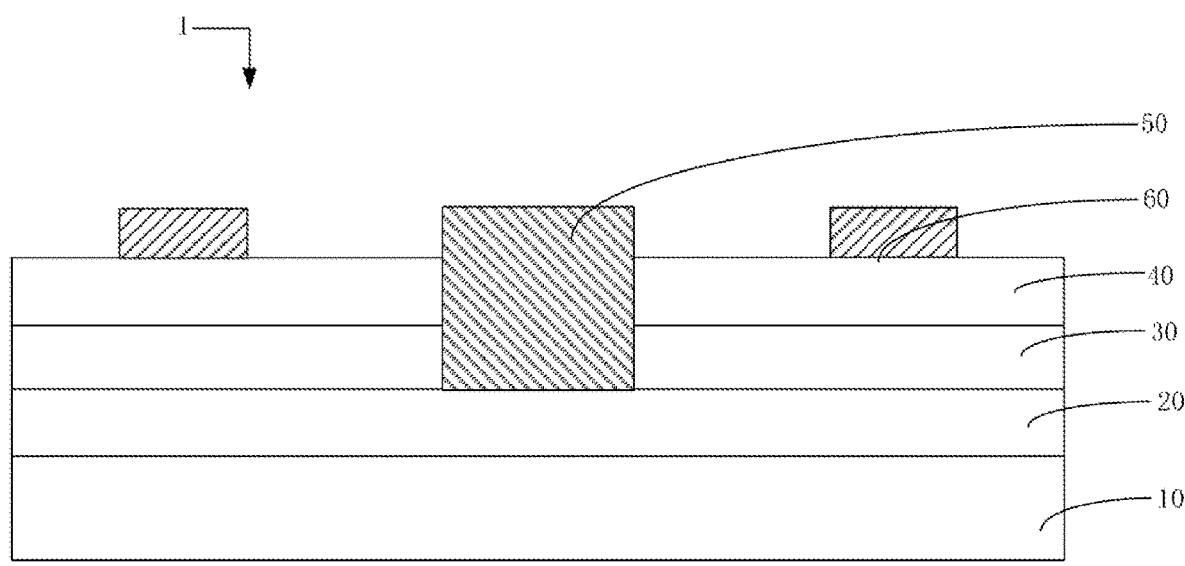
FIG. 2 is a second schematic cross-section view of a light emitting device provided by an embodiment of the present disclosure.

Please refer to FIG. 1 and FIG. 2. A light emitting device 1 provided by an embodiment of the present disclosure includes a first substrate 10, a N-type contact layer 20 disposed on the first substrate 10, an active layer 30 disposed on the N-type contact layer 20; and a P-type contact layer 40 disposed on the active layer 30, wherein a first electrode 50 and a second electrode 60 arranged around the first electrode 50 are disposed on the P-type contact layer 40.

In the present embodiment, the light emitting device 1 includes the first substrate 10, the N-type contact layer 20 disposed on the first substrate 10, the active layer 30 disposed on the N-type contact layer 20; and the P-type contact layer 40 disposed on the active layer 30, wherein the first electrode 50 and the second electrode 60 arranged around the first electrode 50 are disposed on the P-type contact layer 40. The transfer of Mini LED can be completed by arranging the second electrode 60 around the first electrode 50, arranging the second electrode 60 at a position where a distance from each of points on the second electrode 60 to a center point (not shown) of the first electrode 50 is equal, and abutting and aligning any point on the second electrode 60 with the corresponding electrode of a thin film transistor (TFT) device (not shown). The difficulty in the massive transfer of the light emitting device 1 can be reduced.

As shown in FIG. 1, when the first electrode 50 is a P-type electrode and the second electrode 60 is a N-type electrode, the second electrode 60 abuts and aligns a ground terminal 1053 of the TFT device (not shown). The first electrode 50 is connected to the P-type contact layer 40 through a via hole, and the second electrode 60 is connected to the N-type contact layer 20 through a via hole.

As shown in FIG. 2, when the first electrode 50 is a N-type electrode and the second electrode 60 is a P-type electrode, the second electrode 60 abuts and aligns a source electrode 1051 of the TFT device (not shown). The first electrode 50 is connected to the N-type contact layer 20 through a via hole, and the second electrode 60 is connected to the P-type contact layer 20 through a via hole.

Figure 3:
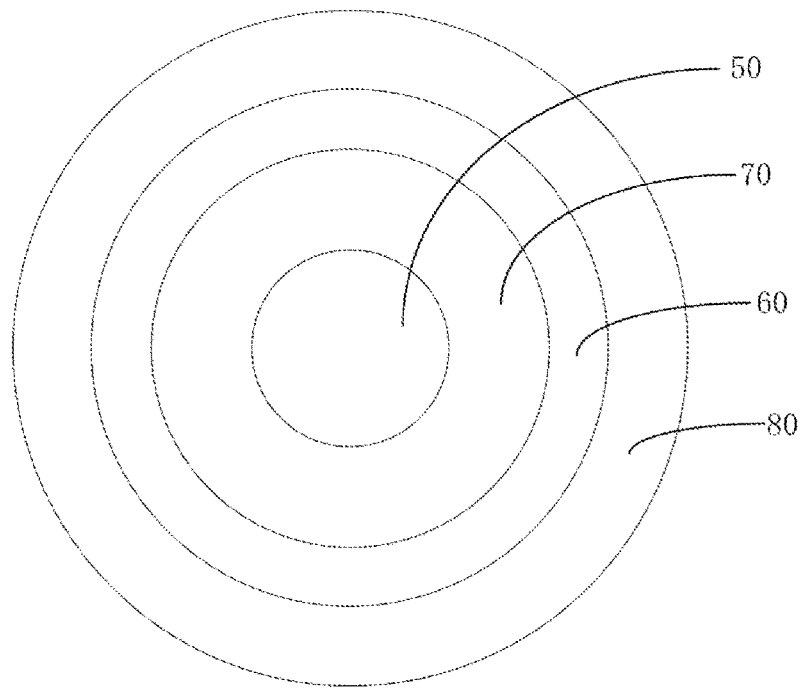
FIG. 3 is a schematic to view of a light emitting device provided by an embodiment of the present disclosure.

In an embodiment, as shown in FIG. 3, a PN insulating layer 70 is disposed between the first electrode 50 and the second electrode 60.

The light emitting device 1 further includes the PN insulating layer 70, and the PN insulating layer 70 is arranged to around and in contact to the second electrode 60.

The first electrode 50 has a cylindrical structure, and the second structure 60 has a circular ring structure.

In an embodiment, the first electrode 50 is a P-type electrode, and the second electrode 60 is a N-type electrode.

In an embodiment, the first electrode 50 is a N-type electrode, and the second electrode 60 is a p-type electrode.

In an embodiment, the second electrode 60 is arranged around the first electrode 50, and a distance from each of points on the second electrode 60 to a center point of the first electrode 50 is equal.

In an embodiment, a width of the first electrode 50 is greater than or equal to a width of the second electrode 60 in a same cross section.

In an embodiment, a first encapsulation layer 80 is disposed on a surface of the second electrode 60 away from the first electrode 50, and the first encapsulation layer 80 is arranged around the second electrode 60.

In an embodiment, a preparation material of the P-type contact layer 40 includes gallium nitride, and/or a preparation material of the N-type contact layer 20 includes gallium nitride.

Figure 4:
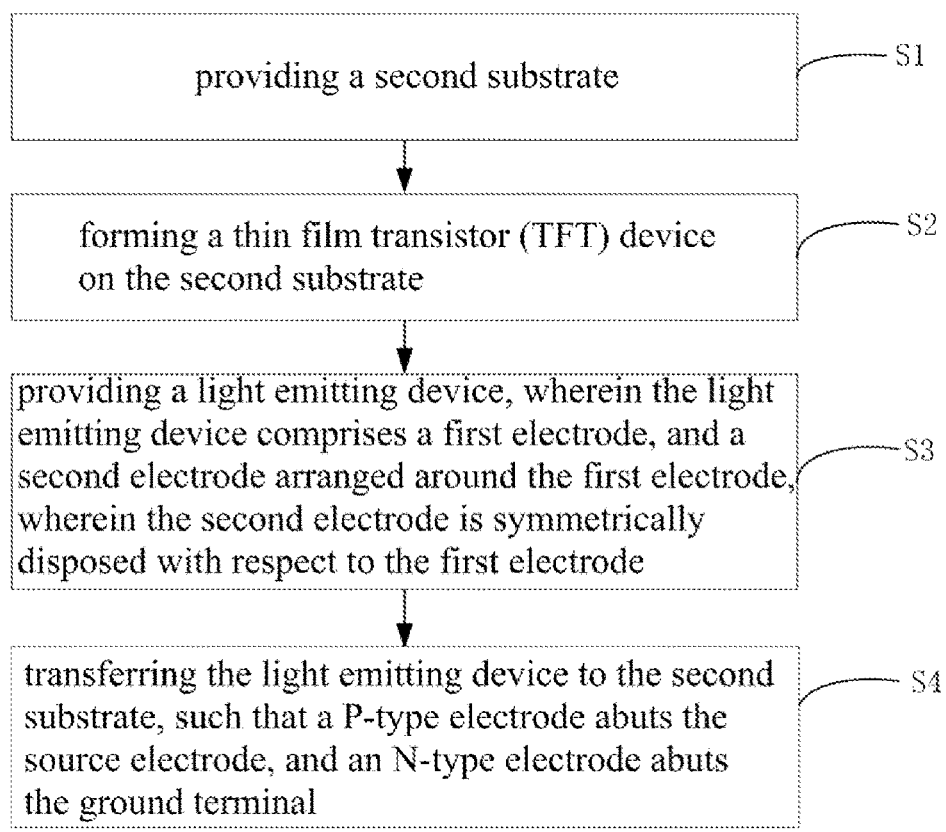
FIG. 4 is a flowchart of a display panel manufacturing method provided by an embodiment of the present disclosure.

Please refer to FIG. 4. A display panel 2 manufacturing method provided by the present disclosure includes steps of:

S1: providing a second substrate 101.

S2: forming a TFT device (not shown) on the second substrate 101.

S3: providing a light emitting device 1, wherein the light emitting device 1 includes a first electrode 50, and a second electrode 50 arranged around the first electrode 60, wherein the second electrode 60 is symmetrically disposed with respect to the first electrode 60.

S4: transferring the light emitting device 1 to the second substrate 101, such that a P-type electrode abuts the source electrode 1051, and an N-type electrode abuts the ground terminal 1053.

In an embodiment, the step of transferring the light emitting device 1 to the second substrate 101 further includes a step of: abutting and aligning the second electrode 60 and the ground terminal 1053 when the first electrode 50 of the light emitting device 1 is the P-type electrode and the second electrode 60 is the N-type electrode.

In this embodiment, when the second electrode of the light emitting device is the N-type electrode, the N-type electrode needs to be arranged in abutment with the ground terminal. Therefore, it is only necessary to align and contact any point on the N-type electrode with the ground terminal. It is not necessary to distinguish the front and back directions of the light emitting device. It is only necessary to align the N-type electrode located on the outer side with the ground terminal to achieve the transfer of the light emitting device.

In an embodiment, the step of the transferring the light emitting device 1 to the second substrate 101 further includes a step of: abutting and aligning the second electrode 60 and the source electrode 1051 when the first electrode 50 of the light emitting device 1 is the N-type electrode and the second electrode is the P-type electrode.

In this embodiment, when the second electrode of the light emitting electrode is the P-type electrode, the P-type electrode needs to be arranged in abutment with the source electrode. Therefore, it is only necessary to align and contact any point on the P-type electrode to the source electrode. It is not necessary to distinguish the front and back directions of the light emitting device. It is only necessary to align the P-type electrode located on the outer side with the ground terminal to achieve the transfer of the light emitting device.

Figure 5:
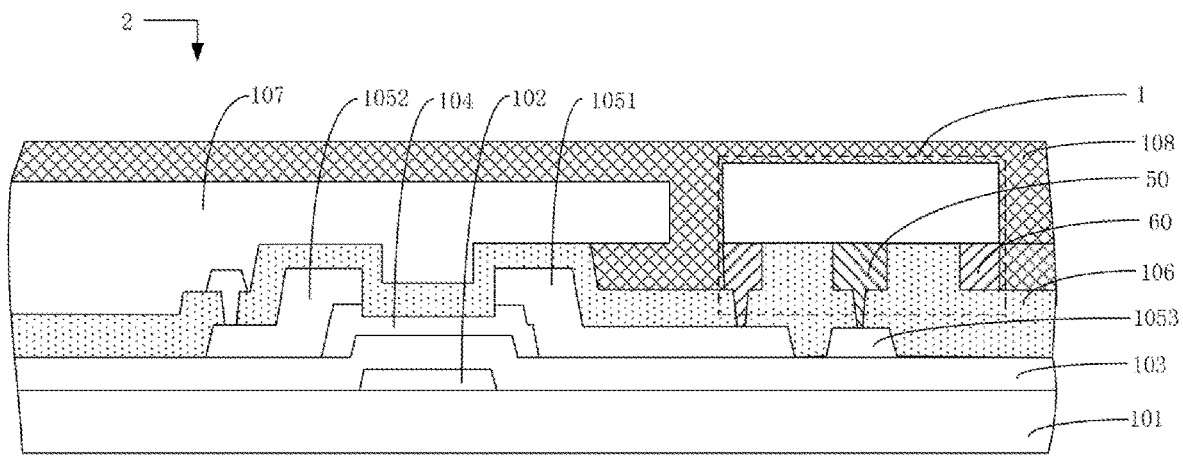
FIG. 5 is a first schematic cross-section view of a display panel provided by an embodiment of the present disclosure.
Figure 6:
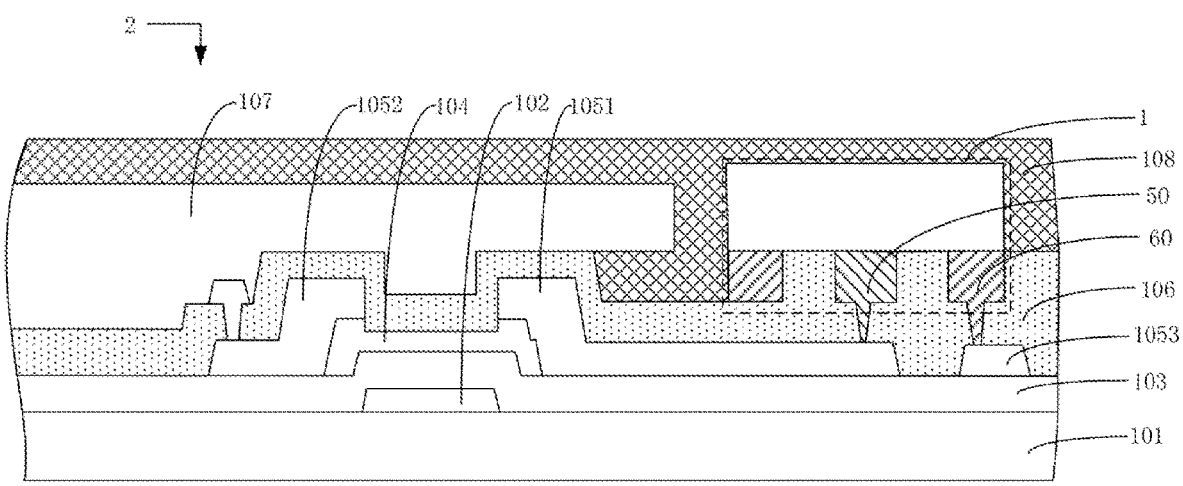
FIG. 6 is a second schematic cross-section view of a display panel provided by the present disclosure.

Please refer to FIG. 5 and FIG. 6. A display panel 2 provided by the present disclosure includes a second substrate 101, a TFT device (not shown) disposed on the second substrate, and a light emitting device 1 disposed on disposed on the second substrate 101. The TFT device (not shown) includes a source electrode 1051 and a ground terminal 1053. The light emitting device 1 includes a first electrode 50, and a second electrode 60 arranged around the first electrode 50, wherein the second electrode 60 is symmetrically disposed with respect to the first electrode 50. When the first electrode 50 is a P-type electrode, the first electrode 50 is arranged in abutment with the source electrode 1051, and the second electrode 60 is arranged in abutment with the ground terminal 1053, or when the first electrode 50 is a N-type electrode, the first electrode 50 is arranged in abutment with the ground terminal 1053, and the second electrode 60 is arranged in abutment with the source electrode 1051.

In this embodiment, the display panel 2 includes the second substrate 101, the TFT device (not shown) disposed on the second substrate, and the light emitting device 1 disposed on disposed on the second substrate 101. The TFT device (not shown) includes the source electrode 1051 and the ground terminal 1053. The light emitting device 1 includes the first electrode 50, and the second electrode 60 arranged around the first electrode 50, wherein the second electrode 60 is symmetrically disposed with respect to the first electrode 50. When the first electrode 50 is the P-type electrode, the first electrode 50 is arranged in abutment with the source electrode 1051, and the second electrode 60 is arranged in abutment with the ground terminal 1053, or when the first electrode 50 is the N-type electrode, the first electrode 50 is arranged in abutment with the ground terminal 1053, and the second electrode 60 is arranged in abutment with the source electrode 1051. By arranging the configuration of Mini Led so that the second electrode 60 around the first electrode 50, therefore, it is only necessary to determine whether the second electrode 60 is the N-type electrode or the P-type electrode, and then the second electrode 60 is abutted upon and aligned with the corresponding electrode of the TFT device (not shown). The difficulty in the massive transfer can be reduced.

The TFT device (not shown) includes a gate electrode 102, a gate insulating layer 103, a semiconductor layer 104, the source electrode 1051, a drain electrode 1052, and a passivation layer 106.

In addition, a black matrix layer 107 is disposed above the TFT device (not shown).

In addition, a second encapsulation layer 108 is disposed above the black matrix layer 107 and the light emitting device 1.

In an embodiment, when the first electrode 50 is the N-type electrode, the first electrode 50 is arranged in abutment with the ground terminal 1053, and the second electrode 60 is arranged in abutment with the source electrode 1051.

In addition, when the first electrode 50 is the N-type electrode, the second electrode 60 is the P-type electrode.

In addition, the second electrode 60 abuts and aligns the source electrode 1051.

In this embodiment, the P-type electrode is arranged around the N-type electrode, and a PN insulating layer 70 is disposed between the P-type electrode and the N-type electrode. The P-type electrode is spaced from the N-type electrode by an insulated structure which is disposed around the P-type electrode and the N-type electrode. Moreover, the P-type electrode has a circular ring structure, and a distance from any points on the P-type electrode to a center point of the N-type electrode is equal. Therefore, it is only necessary to select any point on the P-type electrode to be abutted upon and aligned with the source electrode 1051, then the N-type electrode is aligned with the ground terminal 1053. The time for massive transfer of Mini LED can be reduced.

In an embodiment, in the display panel, the PN insulating layer 70 is further disposed between the first electrode 50 and the second electrode 60.

In an embodiment, in the display panel, the first electrode 50 is the P-type electrode/the N-type electrode, and the second electrode 60 is the N-type electrode/the P-type electrode.

In an embodiment, in the display panel, the second electrode 60 is arranged around the first electrode 50, a distance from each of points on the second electrode 60 to a center point of the first electrode 50 is equal.

In an embodiment, in the display panel, a width of the first electrode 50 is greater than or equal to a width of the second electrode 60 in a same cross section.

In an embodiment, in the display panel, a first encapsulation layer 80 is disposed on a surface of the second electrode 60 away from the first electrode 50, and the first encapsulation layer 80 is arranged around the second electrode 60.

In an embodiment, when the first electrode 50 is the P-type electrode, the first electrode is arranged in abutment with the source electrode 1051, and the second electrode 60 is arranged in abutment with the ground terminal 1053.

When the first electrode 50 is the P-type electrode, the second electrode 60 is the N-type electrode.

The first electrode 50 abuts and aligns the source electrode 1051.

In this embodiment, the N-type electrode is arranged around the P-type electrode, and the PN insulating layer 70 is disposed between the P-type electrode and the N-type electrode. The P-type electrode is spaced from the N-type electrode by an insulated structure which is disposed around the P-type electrode and the N-type electrode. Moreover, the N-type electrode has a circular ring structure, and a distance from any points on the N-type electrode to a center point of the P-type electrode is equal. Therefore, it is only necessary to select any point on the N-type electrode to be abutted upon and aligned with the ground terminal 1053, then the P-type electrode is aligned with the ground terminal 1053. The time for massive transfer of Mini LED can be reduced.

The present disclosure provides a light emitting device 1 in which the first electrode 50 is the P-type electrode and the second electrode is the N-type electrode, and a light emitting device 1 in which the first electrode 50 is the N-type electrode and the second electrode is the P-type electrode. According to actual needs, one of the light-emitting devices 1 needs to be selected, and it is only necessary to determine the connection relationship between the second electrode 60 and the TFT device (not shown).

The light emitting device provided by the present embodiment includes a first substrate, a N-type contact layer disposed on the first substrate, an active layer 30 disposed on the N-type contact layer, and a P-type contact layer disposed on the active layer 30; wherein a first electrode and a second electrode arranged around the first electrode are disposed on the P-type contact layer. The transfer of Mini LED can be completed by arranging the second electrode around the first electrode, arranging the second electrode at a position where a distance from each of points on the second electrode to a center point of the first electrode is equal, and abutting and aligning any point on the second electrode with the corresponding electrode of the TFT device. The difficulty in the massive transfer of the light emitting device can be reduced.

In view of the above, although the present invention has been disclosed by way of preferred embodiments, the above preferred embodiments are not intended to limit the present invention, and one of ordinary skill in the art, without departing from the spirit and scope of the invention, the scope of protection of the present invention is defined by the scope of the claims.

What is claimed is:
1. A light emitting device, comprising:
 a first substrate;
 a N-type contact layer disposed on the first substrate;
 an active layer disposed on the N-type contact layer; and
 a P-type contact layer disposed on the active layer;
 wherein a first electrode and a second electrode arranged around the first electrode are disposed on the P-type contact layer, in response to the first electrode being an N-type electrode and the second electrode being a P-type electrode, the first electrode is connected to the N-type contact layer through a via hole, or in response to the first electrode being a P-type electrode and the second electrode being an N-type electrode, the second electrode is connected to the N-type contact layer through a via hole; and
 wherein a first encapsulation layer is disposed at a side of the second electrode away from the first electrode, and the first encapsulation layer is arranged around the second electrode.

2. The light emitting device according to claim 1, wherein a PN insulating layer is disposed between the first electrode and the second electrode.

3. The light emitting device according to claim 2, wherein the second electrode is arranged around the first electrode, and a distance from each of points on a circumferential line of the second electrode to a center point of the first electrode is equal.

4. The light emitting device according to claim 3, wherein a width of the first electrode is greater than or equal to a width of the second electrode in a same cross section.

5. The light emitting device according to claim 2, wherein the first electrode has a cylindrical structure, and the second electrode has a circular ring structure.

6. The light emitting device according to claim 2, wherein a preparation material of the P-type contact layer comprises gallium nitride.

7. The light emitting device according to claim 2, wherein a preparation material of the N-type contact layer comprises gallium nitride.

8. A display panel, comprising:
 a second substrate;
 a thin film transistor (TFT) device disposed on the second substrate, wherein the TFT device comprises a source electrode and a ground terminal; and
 a light emitting device disposed on the second substrate, wherein the light emitting device comprises a first electrode, and a second electrode arranged around the first electrode;
 wherein in response to the first electrode being a P-type electrode, the first electrode is arranged in abutment with the source electrode, and the second electrode is arranged in abutment with the ground terminal, or in response to the first electrode being an N-type electrode, the first electrode is arranged in abutment with the ground terminal, and the second electrode is arranged in abutment with the source electrode; and wherein a first encapsulation layer is disposed at a side of the second electrode away from the first electrode, and the first encapsulation layer is arranged around the second electrode.

9. The display panel according to claim 8, wherein either the first electrode is the N-type electrode, and the second electrode is the P-type electrode, or the first electrode is the P-type electrode, and the second electrode is the N-type electrode.

10. The display panel according to claim 9, wherein the second electrode is arranged around the first electrode, and a distance from each of points on a circumferential line of the second electrode to a center point of the first electrode is equal.

11. The display panel according to claim 10, wherein a width of the first electrode is greater than or equal to a width of the second electrode.

12. The display panel according to claim 8, wherein the first electrode is the N-type electrode, the first electrode is arranged in abutment with the ground terminal, and the second electrode is arranged in abutment with the source electrode.

13. The display panel according to claim 8, wherein the second electrode is the N-type electrode, the second electrode is arranged in abutment with the ground terminal, and the first electrode is arranged in abutment with the source electrode.

14. The display panel according to claim 8, wherein a black matrix layer is disposed above the TFT device.

15. The display panel according to claim 14, wherein a second encapsulation layer is disposed above the black matrix layer and the light emitting device.

16. The display panel according to claim 8, wherein the light emitting device further comprises:
a first substrate;
a N-type contact layer disposed on the first substrate;
an active layer disposed on the N-type contact layer; and
a P-type contact layer disposed on the active layer;
wherein the first electrode and the second electrode are disposed on the P-type contact layer; and
wherein the first electrode is an N-type electrode and the second electrode is a P-type electrode, the first electrode is connected to the N-type contact layer through a via hole; or, the first electrode is a P-type electrode and the second electrode is an N-type electrode, and the second electrode is connected to the N-type contact layer through a via hole.

17. The display panel according to claim 8, wherein the first electrode has a cylindrical structure, and the second electrode has a circular ring structure; and wherein a circumferential line of the second electrode is in a circular shape.

18. A display panel manufacturing method, comprising steps of:
providing a second substrate;
forming a thin film transistor (TFT) device on the second substrate;
providing a light emitting device, wherein the light emitting device comprises a first electrode, and a second electrode arranged around the first electrode,
wherein the second electrode is symmetrically disposed with respect to the first electrode; and
wherein a first encapsulation layer is disposed at a side of the second electrode away from the first electrode, and the first encapsulation layer is arranged around the second electrode; and
transferring the light emitting device to the second substrate, such that a P-type electrode abuts a source electrode, and an N-type electrode abuts a ground terminal.

19. The display panel manufacturing method according to claim 18, wherein the transferring the light emitting device to the second substrate further comprises a step of:
abutting and aligning the second electrode and the ground terminal in response to the first electrode of the light emitting device being the P-type electrode and the second electrode being the N-type electrode.

20. The display panel manufacturing method according to claim 18, wherein the transferring the light emitting device to the second substrate further comprises a step of:
abutting and aligning the second electrode and the source electrode in response to the first electrode of the light emitting device being the N-type electrode and the second electrode being the P-type electrode.

* * * * *